(12) United States Patent
Mu

(10) Patent No.: US 7,902,937 B2
(45) Date of Patent: Mar. 8, 2011

(54) POSITIVE COEFFICIENT WEIGHTED QUADRATURE MODULATION METHOD AND APPARATUS

(75) Inventor: Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 46 days.

(21) Appl. No.: 12/534,294

(22) Filed: Aug. 3, 2009

(65) Prior Publication Data

US 2011/0026638 A1    Feb. 3, 2011

(51) Int. Cl.
*H04L 27/20* (2006.01)
(52) U.S. Cl. ........................................ 332/103; 332/105
(58) Field of Classification Search .......... 332/103–105
See application file for complete search history.

(56) References Cited

U.S. PATENT DOCUMENTS

| | | | |
|---|---|---|---|
| 6,768,391 B1 * | 7/2004 | Dent et al. | ..................... 332/185 |
| 7,183,844 B2 | 2/2007 | Klomsdorf et al. | |
| 7,202,747 B2 | 4/2007 | Forse et al. | |
| 2006/0078067 A1 | 4/2006 | Brobston | |
| 2009/0066440 A1 | 3/2009 | Chan Wai Po et al. | |

FOREIGN PATENT DOCUMENTS

WO    2006/033722 A2    3/2006

* cited by examiner

*Primary Examiner* — David Mis
(74) *Attorney, Agent, or Firm* — Coats & Bennett, P.L.L.C.

(57) ABSTRACT

A differential positive coefficient weighted quadrature modulator is actuated responsive to quadrature clock signals and positive digital modulation signals input to the modulator. The modulator includes an I-channel positive coefficient weighted modulator (PCWM) and a Q-channel PCWM. The I-channel PCWM has differential output nodes configured to output a differential I-channel signal responsive to the state of first and second positive digital modulation signals and first and second complimentary quadrature clock signals input to the I-channel PCWM. The Q-channel PCWM has differential output nodes configured to output a differential Q-channel signal responsive to the state of third and fourth positive digital modulation signals and third and fourth complimentary quadrature clock signals input to the Q-channel PCWM. The positive digital modulation signals input to the I-channel and Q-channel PCWMs have positive amplitude and the I-channel and Q-channel PCWMs conduct at approximately half clock cycle or less of the corresponding quadrature clock signals.

26 Claims, 14 Drawing Sheets

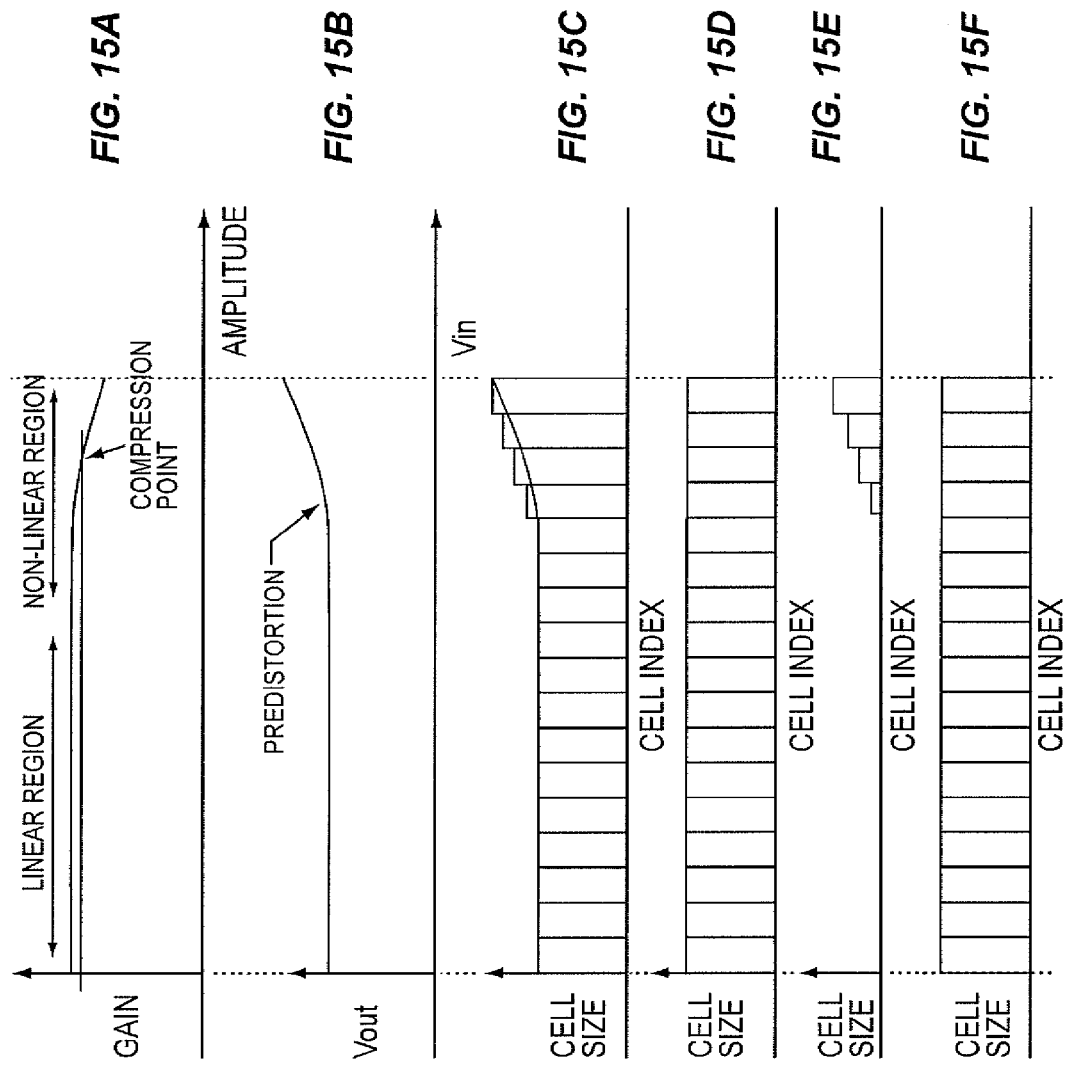

POSITIVE COEFFICIENT WEIGHTED QUADRATURE MODULATION METHOD AND APPARATUS

TECHNICAL FIELD

The present invention generally relates to signal modulation, and more particularly relates to positive coefficient weighted modulation used in RF transmitters.

BACKGROUND

A conventional RF transmitter typically includes a baseband digital signal processor (DSP), two digital-to-analog converters (DAC), low pass filters (LPF) for quadrature channels, a quadrature modulator, a variable gain amplifier (VGA) and a power amplifier (PA). In this architecture, the quadrature modulator is operated at a relatively low level to maintain linearity while the VGA and PA are used to deliver the required RF power level. To modulate the baseband signals to a carrier RF signal and transmit over the air, the transmitter also needs quadrature clocks at the carrier frequency, DAC conversion reconstruction clocks and a control clock. Non-linearity in the components included in the RF transmitter creates harmonic distortions and inter-modulation products. These unwanted frequency components can cause spurious emissions and interference to neighboring receivers or the receiver associated with the RF transmitter, e.g. in transceiver structures.

To avoid such interference, the linearity requirements for the LPFs, quadrature modulator and VGA are very high, increasing the design complexity of these components. High linearity usually implies high power consumption, as the affected analog components operate as class A devices, resulting in a poor power efficiency. In addition, active and passive components, such as filter capacitors and large transistors for minimizing flicker noise, occupy additional silicon area which increases cost. Furthermore, analog circuits are much sensitive to process, temperature and supply voltage variation. Device matching is also a problem for deep submicron CMOS.

To relax the design difficulty associated with analog circuits and reduce area and power consumption, some conventional RF transmitters merge the DAC, LPF, quadrature modulator and VGA functions together into a digital cell. The resulting digital quadrature modulator utilizes DSP and other digital techniques to perform baseband signal processing, such as gain setting, over-sampling, interpolation and low pass filtering. In the final stage of a conventional digital quadrature modulator, the carrier clock signals are modulated by digital baseband signals and converted into modulated RF signals. Because the digital baseband signals have smaller distortion than their analog counterparts, depending on the digital signal processing accuracy or word length which is normally enough, linearity is improved. In addition, area occupation may be smaller than the equivalent analog components because large capacitors are not needed.

However, a conventional digital quadrature modulator does not include the power amplifier component of an RF transmitter, and it needs an additional power amplifier to reach the required power level. This creates redundant areas in the modulator and the power amplifier when considering the entire area of the modulator, pads and power amplifier. In addition, conventional digital quadrature modulators typically drive a 50 Ohm impedance and thus power consumption tends to be relatively high at the modulator output. Also, the power efficiency of the modulator and power amplifier tends to be lower because both components typically operate linearly in class A mode. Operating the modulator and power amplifier in class A mode results in constant power consumption, resulting in very low power efficiency at low output signal levels. Non-linear distortion is also difficult to compensate for in conventional power amplifiers, which gives rise to additional interference in the radio band. Since a power amplifier is not typically included as part of a conventional digital quadrature modulator, system integration is not optimized which further increases the cost of the final RF transmitter structure.

SUMMARY

According to the methods and apparatus disclosed herein, a differential positive coefficient weighted quadrature modulator is actuated responsive to quadrature clock signals and positive digital modulation signals input to the modulator. In one embodiment, the positive digital modulation signals are obtained by converting original digital modulation signals using digital logic. Using positive digital modulation signals to actuate the differential positive coefficient weighted quadrature modulator increases the power efficiency of the modulator. The differential positive coefficient weighted quadrature modulator also has lower odd-order harmonic distortion compared to class A biased modulators. A plurality of paralleled differential positive coefficient weighted quadrature modulators can be directly operated as a digital modulated power amplifier, thus the modulator, the variable gain amplifier and the power amplifier function are merged together, reducing the area redundancy and power consumption as well as additional noise introduced by multi-stage amplifications in the RF components. In a digital modulated power amplifier, the input signals are digital modulation signals, carrier clock signals, and the output signal is an RF signal at a desired power level, e.g. according to a standard, the output signal being coupled to an antenna through output match networks.

According to an embodiment of a method for amplifying quadrature information signals, the method includes generating differential I-channel and Q-channel signals. The differential I-channel signal is generated at differential output nodes of an I-channel positive coefficient weighted modulator responsive to the state of first and second positive digital modulation signals and first and second complimentary quadrature clock signals input to the I-channel positive coefficient weighted modulator. The differential Q-channel signal is generated at differential output nodes of a Q-channel positive coefficient weighted modulator responsive to the state of third and fourth positive digital modulation signals and third and fourth complimentary quadrature clock signals input to the Q-channel positive coefficient weighted modulator. The positive digital modulation signals input to the I-channel and Q-channel positive coefficient weighted modulators have positive amplitude and the I-channel and Q-channel positive coefficient weighted modulators conduct at approximately half clock cycle or less of the corresponding quadrature clock signals. The differential I-channel and Q-channel signals can be coupled to a load for providing power amplification.

According to an embodiment of a differential quadrature modulator, the modulator includes an I-channel positive coefficient weighted modulator and a Q-channel positive coefficient weighted modulator. The I-channel positive coefficient weighted modulator has differential output nodes configured to output a differential I-channel signal responsive to the state of first and second positive digital modulation signals and first and second complimentary quadrature clock signals input to the I-channel positive coefficient weighted modulator. The Q-channel positive coefficient weighted modulator has differential output nodes configured to output a differential Q-channel signal responsive to the state of third and fourth positive digital modulation signals and third and fourth complimentary quadrature clock signals input to the Q-channel positive coefficient weighted modulator. The positive digital modulation signals input to the I-channel and Q-channel positive coefficient weighted modulators have positive amplitude and the I-channel and Q-channel positive coefficient weighted modulators conduct at approximately half clock cycle or less of the corresponding quadrature clock signals. A digital quadrature modulated differential power amplifier can be formed by coupling a plurality of the differential quadrature modulators to a load.

Of course, the present invention is not limited to the above features and advantages. Those skilled in the art will recognize additional features and advantages upon reading the following detailed description, and upon viewing the accompanying drawings.

BRIEF DESCRIPTION OF THE DRAWINGS

FIGS. 15(a)-(f) illustrate different embodiments for extending the linearity of a plurality of coupled digital quadrature modulated differential power amplifiers.

DETAILED DESCRIPTION

Figure 1:
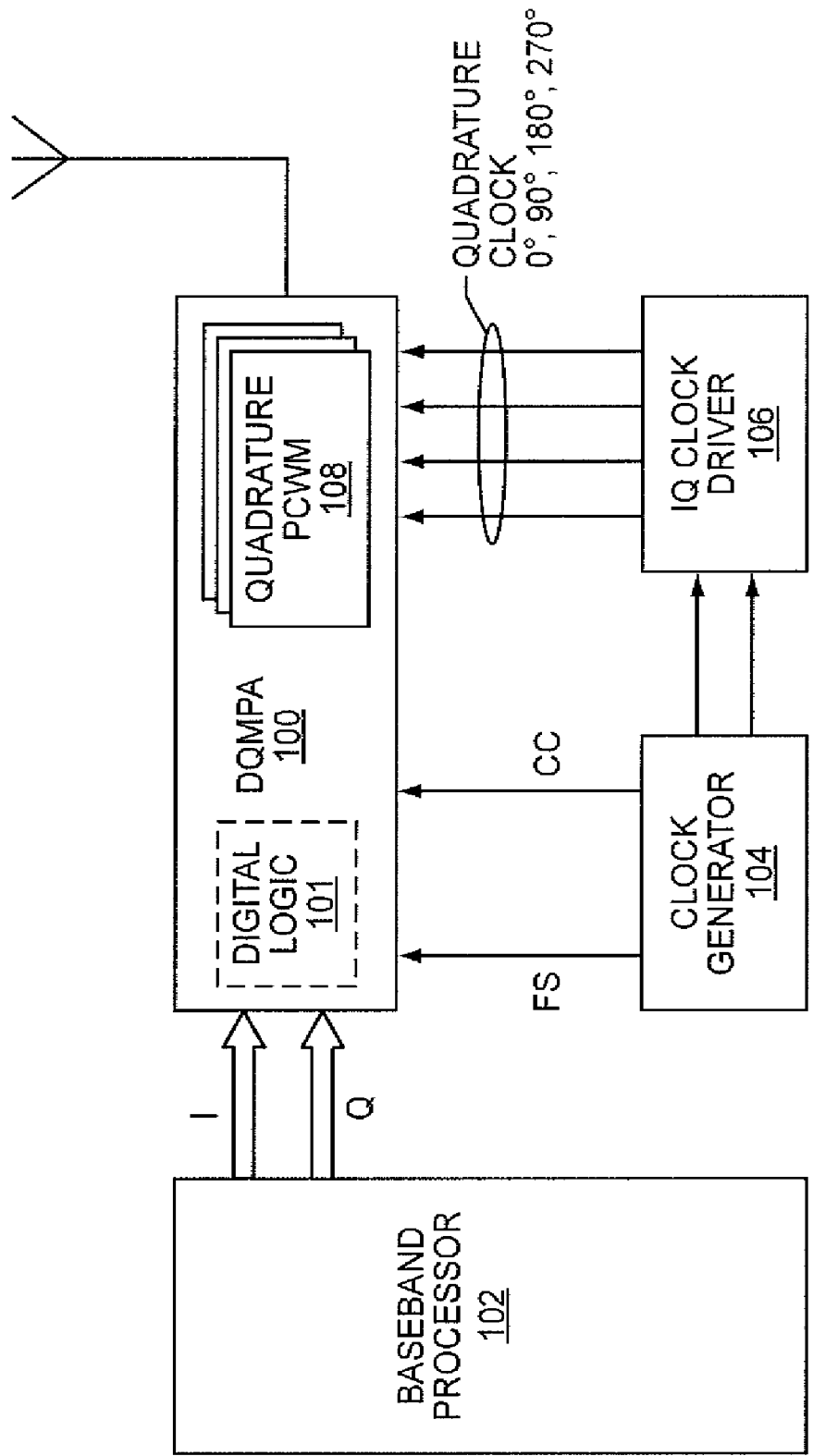
FIG. 1 illustrates a block diagram of an embodiment of an RF transmitter including a digital quadrature modulated differential power amplifier.

FIG. 1 illustrates an embodiment of an RF transmitter including a digital quadrature modulated differential power amplifier (DQMPA) 100, a baseband processor 102, a clock generator circuit 104 and a clock driver circuit 106. The baseband processor 102 provides in-phase (I) and quadrature (Q) information signals to the DQMPA 100 for modulation, amplification and transmission. The clock driver circuit 106 provides quadrature clock signals (0°, 90°, 180° and 270°) to the DQMPA 100 responsive to clock signals generated by the clock generator circuit 104. The clock generation circuit 104 also provides DAC conversion reconstruction clocks (FS) and a control clock (CC) to the DQMPA 100. The DQMPA 100 modulates and amplifies the baseband in-phase and quadrature information signals responsive to the state of the quadrature clock signals and positive digital modulation signals input to each quadrature positive coefficient weighted modulator (PCWM) 108 included in the DQMPA 100. Each of the positive digital modulation signals input to the quadrature PCWMs 108 has positive amplitude, thus increasing the power efficiency of the DQMPA 100. In one embodiment, the DQMPA 100 includes digital logic 101 for converting original digital modulation signals into the positive digital modulation signals input to each PCWM 108.

Figure 2:
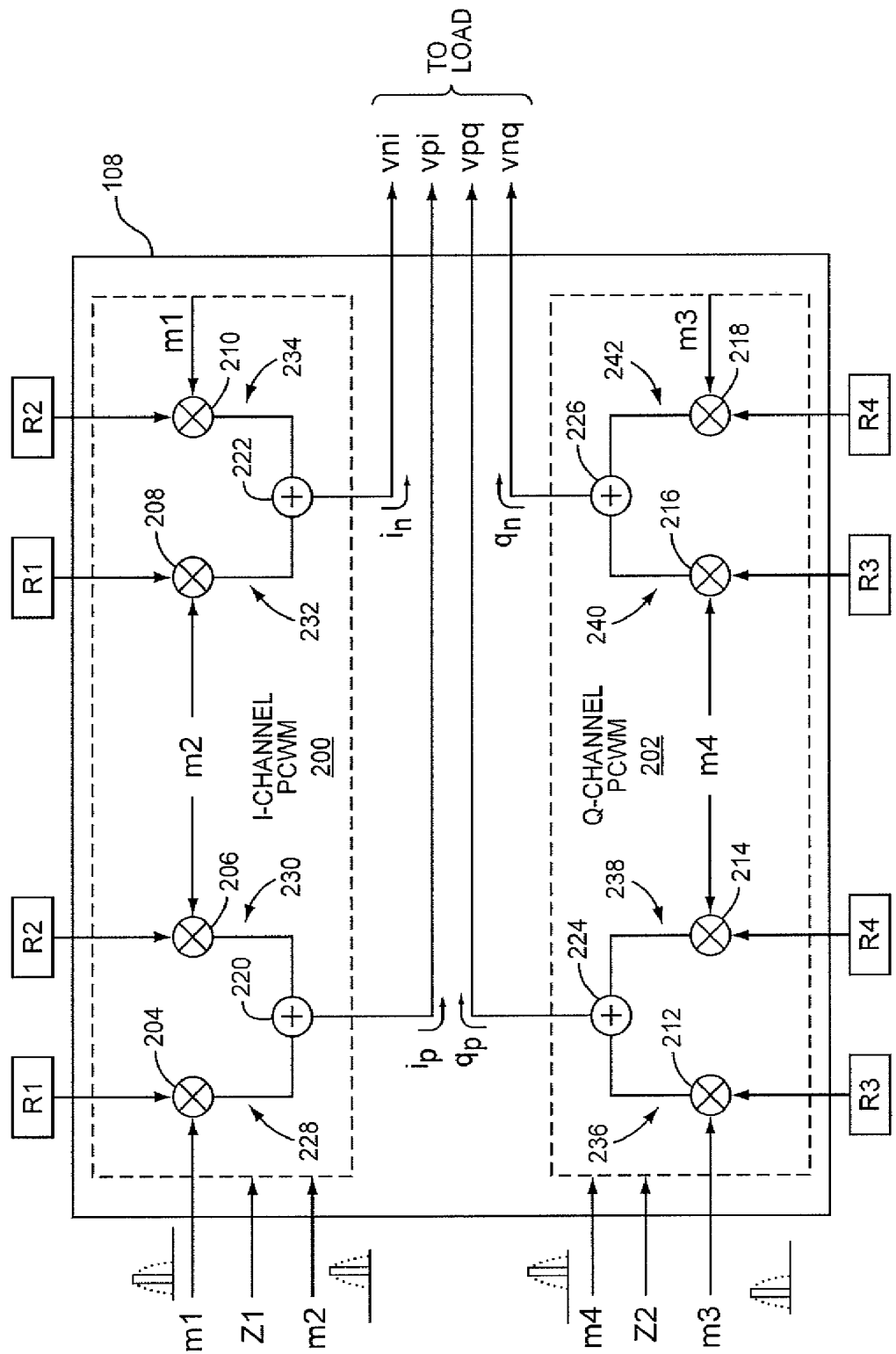
FIG. 2 illustrates a block diagram of an embodiment of a quadrature positive coefficient weighted modulator component of a digital quadrature modulated differential power amplifier.

FIG. 2 illustrates an embodiment of the quadrature PCWM 108 included in the DQMPA 100. Each quadrature PCWM 108 is implemented as parallel switched cells and includes an I-channel PCWM 200 and a Q-channel PCWM 202. The I-channel PCWM 200 and the Q-channel PCWM 202 each includes four multipliers 204-210, 212-218 and two adders 220, 222 and 224, 226. Two positive digital modulation signals (m1 and m2) and two complimentary quadrature clock signals (R1 and R2) are input to the I-channel PCWM 200. Two different positive digital modulation signals (m3 and m4) and two different complimentary quadrature clock signals (R3 and R4) are input to the Q-channel PCWM 202. A control signal (Z1, Z2) is also input to the I-channel and Q-channel PCWMs 200, 202 for controlling the operation of impedance compensation circuitry and/or shut-down circuitry coupled to the respective PCWM modulators 200, 202 as described in more detail later herein.

In more detail, the I-channel PCWM modulator 200 has differential current output nodes (vpi, vni) for outputting a differential I-channel current signal (ip, in) responsive to the state of the positive digital modulation signals m1 and m2 and the complimentary quadrature clock signals R1 and R2 input to the I-channel PCWM 200. The Q-channel PCWM 202 also has differential current output nodes (vpq, vnq) for outputting a differential Q-channel current signal (qp, qn) responsive to the state of the positive digital modulation signals m3 and m4 and the complimentary quadrature clock signals R3 and R4 input to the Q-channel PCWM 202. A digital quadrature modulated output can be provided by merging the current output nodes vpi and vni and current output nodes vpq and vnq.

According to an embodiment, the I-channel and Q-channel PCWMs 200, 202 each have four branches. First and second braches 228, 230 of the I-channel PCWM 200 generate a first component (vpi) of the differential I-channel signal responsive to the state of the positive digital modulation signals m1 and m2 and the complimentary quadrature clock signals R1 and R2. Third and fourth braches 232, 234 of the I-channel PCWM 200 similarly generates a second, complimentary component (vni) of the differential I-channel signal also responsive to m1, m2, R1 and R2. First and second braches 236, 238 of the Q-channel PCWM 202 likewise generate a first component (vpq) of the differential Q-channel signal responsive to the state of the positive digital modulation signals m3 and m4 and the complimentary quadrature clock signals R3 and R4. Third and fourth braches 240, 242 of the Q-channel PCWM 202 generate the complimentary component (vnq) of the differential Q-channel signal also responsive to the state of m3, m4, R3 and R4. According to this embodiment, just one of the modulation signals input to the I-channel and Q-channel portions 200, 202 of each quadrature PCWM 108 is set to a logic high state at any particular point in time to ensure proper operation.

The quadrature clock signals input to each quadrature PCWM 108 are generated by the clock driver circuit 106 of the RF transmitter of FIG. 1 and can be expressed as:

$$R1 = c_a \sin(\omega_{tx}t) + DC_b$$

$$R2 = -c_a \sin(\omega_{tx}t) + DC_b$$

$$R3 = c_a \cos(\omega_{tx}t) + DC_b$$

$$R4 = -c_a \cos(\omega_{tx}t) + DC_b \quad (1)$$

where $DC_b$ is the DC bias voltage of the clock signals and $c_a$ is the amplitude of the clock signals. Each of the positive digital modulation signals input to a particular quadrature PCWM 108 is valid only if its amplitude is larger than or equal to zero, i.e. non-negative, otherwise the modulation signal is set to zero. Differential outputs are used to replace the original modulation signal by adding the positive part of the modulation signal at the other port of the differential output. The positive digital modulation signals are given by:

$$\begin{aligned}
m1 &= m_a \sin(\omega_m t), & \text{if } \sin(\omega_m t) \geq 0 \\
&= 0, & \text{otherwise} \\
m2 &= m_a \sin(\omega_m t + \pi), & \text{if } \sin(\omega_m t + \pi) \geq 0 \\
&= 0, & \text{otherwise} \\
m3 &= m_a \cos(\omega_m t), & \text{when } \cos(\omega_m t) \geq 0 \\
&= 0, & \text{otherwise} \\
m4 &= m_a \cos(\omega_m t), & \text{when } \cos(\omega_m t + \pi) \geq 0 \\
&= 0, & \text{otherwise}
\end{aligned} \quad (2)$$

The positive digital modulation signals m1, m2, m3 and m4 can be coded as a sum of paralleled bitwise digital signals either in binary or in thermometer-coded form.

In general, for positive coefficient weighted modulation, a modulation signal m(t) can be modified as:

$$m_{pcwm}(t) = 0.5m(t) + 0.5|m(t)| \quad (3)$$

Figure 3:
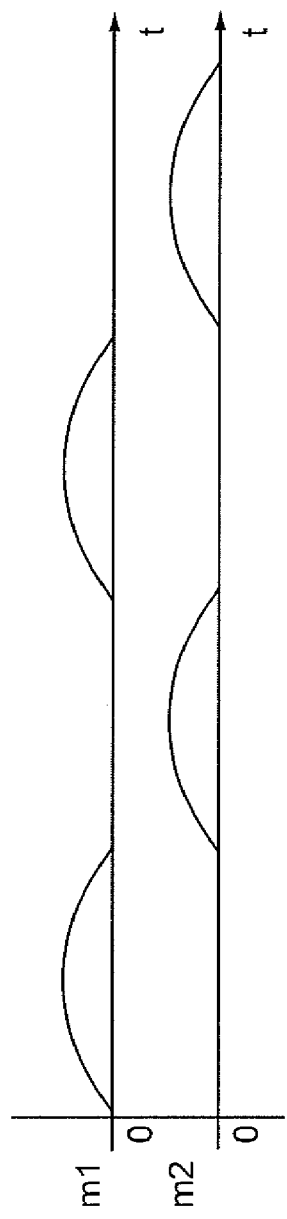
FIG. 3 illustrates positive amplitude modulation signal waveforms for use with a quadrature positive coefficient weighted modulator.
Figure 4:
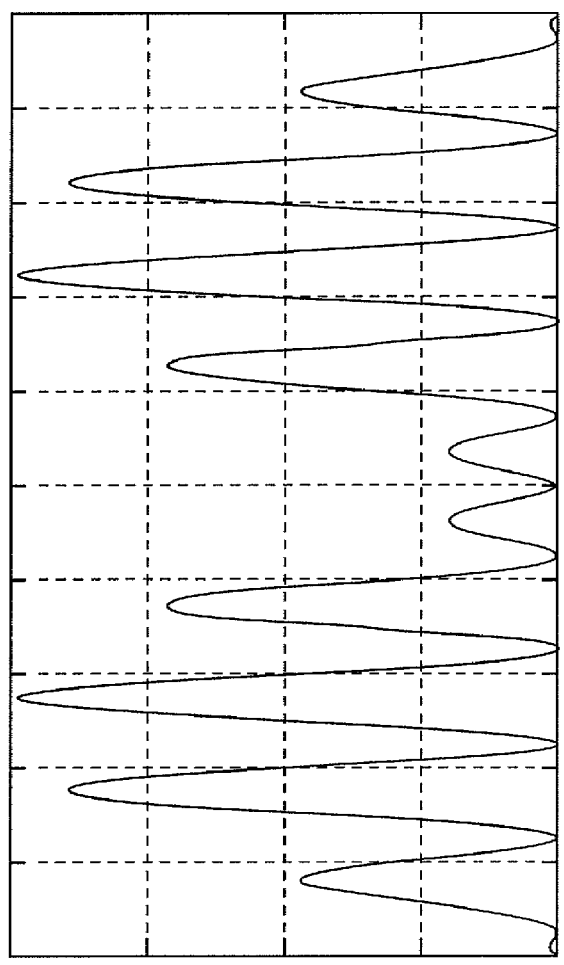
FIG. 4 illustrates a differential current signal waveform output by a quadrature positive coefficient weighted modulator.

Differential outputs are used to implement the negative part of the signal. For example, when the original digital modulation signal for the I-channel is a sinusoid, then the I-channel positive modulation signals m1 and m2 are illustrated in FIG. 3. When $m_a = 1$ and $DC_b = c_a = 1$, i.e., the modulation signals are positive modulation signals and clock signals are DC biased so that the modulator RF transistors are operating in class A, then the current output at the adders 220, 222 of the I-channel PCWM 200 fluctuate as shown in FIG. 4 which shows the drain current of the I-channel PCWM 200. The average DC drain current is $2/\pi = 0.636$ with a peak-to-peak current of 2. Conventional quadrature modulators yield an average DC drain current of 1 and a peak-to-peak current of 2. Thus, when the modulation signals are positive modulation signals and clock signals are DC biased so that the modulator RF transistors are operating in class A, then each quadrature PCWM 108 included in the DQMPA 100 has about a 1.57× power efficiency improvement over a conventional quadrature modulator by using positive modulation signals.

Figure 5A:
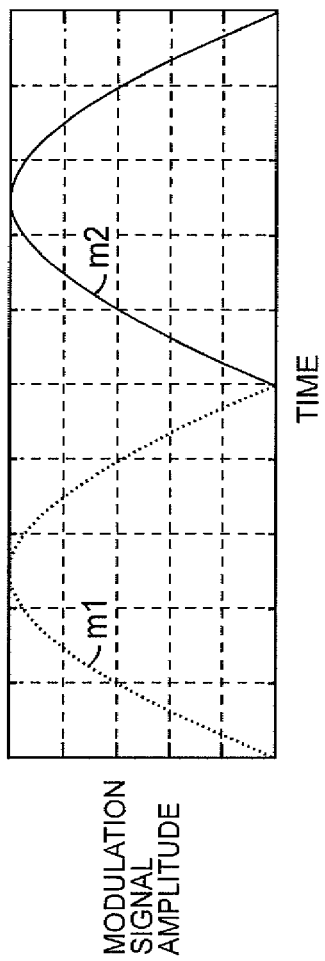
FIGS. 5(a)-5(c) illustrates different waveforms associated with operation of a quadrature positive coefficient weighted modulator.
Figure 5B:
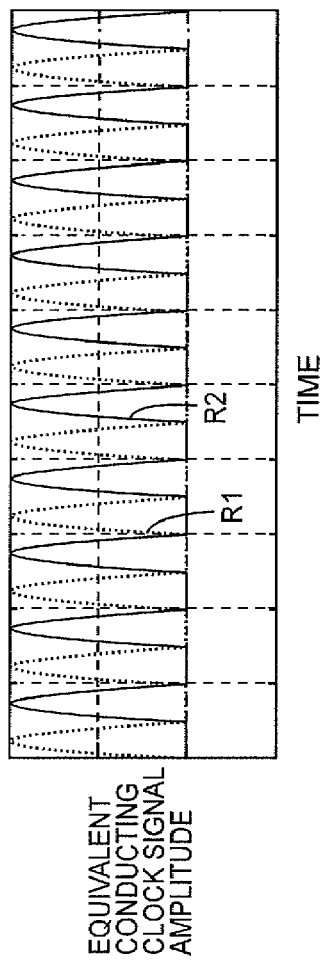
Figure 5C:
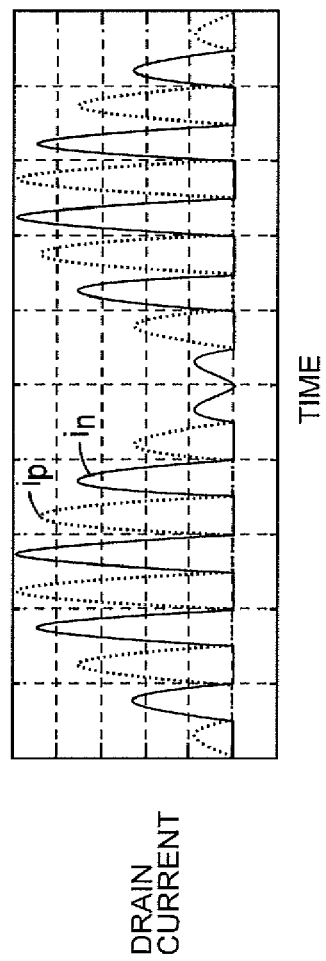

If the bias of the clock signals R1-R4 input to each quadrature PCWM 108 included in the DQMPA 100 is lowered so that the multipliers 204-218 of the PCWM branches 228-242 only conduct at half clock cycles, i.e., the clock signals are DC biased so that the modulator RF transistors are operating in class B, then the power efficiency of the quadrature PCWMs 108 can be further improved as shown in FIGS. 5(a)-5(c). FIG. 5(a) illustrates the modulation signals m1 and m2, FIG. 5(b) illustrates the corresponding equivalent complimentary clock signals R1 and R2 above a DC threshold wherein RF transistors begin to conduct, and FIG. 5(c) illustrates the drain current output by the I-channel PCWM 200 at current output nodes vpi/vni. In FIG. 5(c), the average DC drain current reduces to $4/\pi 2 = 0.405$, yielding a 61% power efficiency improvement over conventional quadrature modulators. The power efficiency of the quadrature PCWMs 108 can be further increased by reducing the conducting angle of the multipliers 204-218 even more and increasing the overdrive, but at a cost of higher distortion and drain voltage. In addition, power consumption is scaled as a function of output voltage, as shown in FIG. 5(c), when the conducting angle of the PCWM 108 is reduced. Utilizing positive coefficient weighted modulation and reduced conducting angles to provide current scaling as disclosed herein yields a highly advantageous solution for power amplification applications, improving the power efficiency at low average power level for wireless standards like OFDM, etc. where peak-to-average-power ratio is high. In contrast, conventional linear power amplifiers have constant power consumption regardless of output voltage/power which is inefficient for low average power level.

The multiplication operation between a modulation signal mx, where x=1,2,3,4, and the corresponding local oscillator clock signal R is performed with parallel switched adders in such a way to yield:

$$Y = mx \cdot R = \left( \sum_{k=1}^{N} mx_k \right) \cdot R = \sum_{k=1}^{N} (mx_k \cdot R) \quad (4)$$

where $mx_k$ is either $m_{sk}$, or 0, and $m_{sk} > 0$, where $m_{sk}$ can be binary weighted, thermometer-coded, uniformed weighted, non-uniformed weighted, etc. N in equation (4) is preferably large enough to reduce quantization noise by a suitable amount and depends on the particular application. Otherwise, quantization noise may be up-converted into RF frequencies which can cause interference for other receivers in the radio band. For a uniform cell, $m_{sk}$ is a constant, and for a non-uniform cell $m_{sk}$ may take different values. The quadrature PCWMs 108 can be implemented in various ways with or without impedance compensation as disclosed herein.

Figure 6:
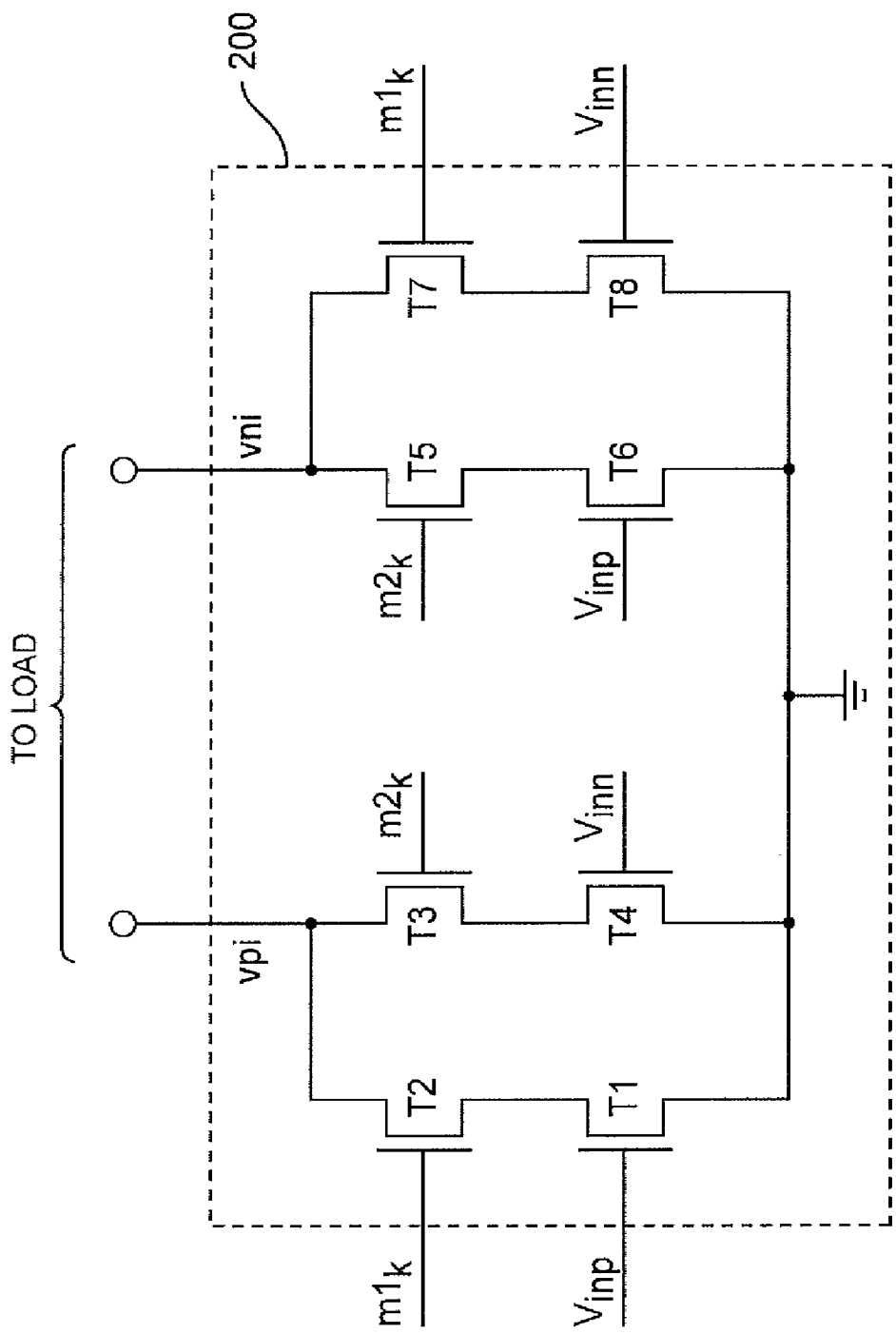
FIG. 6 illustrates a circuit diagram of an embodiment of an I-channel positive coefficient weighted modulator.

FIG. 6 illustrates an embodiment of the I-channel PCWM 200 included in each of the quadrature PCWMs 108. Those skilled in the art will readily recognize that the Q-channel PCWM 202 can be implemented in a similar fashion. Each branch 228-234 of the I-channel PCWM 200 includes a common source transistor (T1, T4, T6, T8) connected in series with a common gate transistor (T2, T3, T5, T7). The drains of the common source and sources of the common gate transistors for each branch 228-234 are electrically connected together. The drain of each common gate transistor is connected to one of the output nodes (vpi or vni). The gate of each common gate transistor is connected to a control node of the branch (i.e., the input node for bitwise modulation signal $m1_k$ and $m2_k$). The source of each common source transistor is connected to a ground node and the gate of each common source transistor is connected to a clock input node of the branch (i.e., the input node for clock signal vinp or vinn).

The NMOS transistors T2, T3, T5 and T7 operate in a switch mode responsive to the bitwise modulation signals $m1_k$ and $m2_k$. The NMOS transistors T1, T4, T6 and T8 are RF transistors connected to the complementary local quadrature clock signals vinp and vinn, or in general the clock signals are taken from R1 and R2, or R3 and R4. The bitwise modulation signals can be created from two binary signals, sign and $b_k$. The sign corresponds to the polarity of the original digital modulation signals, m1, m2, m3 and m4, and $b_k$ is the original bitwise modulation signals for the I-channel PCWM 200. The subscript k, k=1,2, . . . , N, indicates that a plurality of quadrature PCWMs 108 can be included in a structure such as the DQMPA 100 of FIG. 1, and thus indicates the kth quadrature PCWM 108. The bitwise modulation signals $m1_k$ and $m2_k$ can be created from logic according Table 1 below.

TABLE 1

| sign | $b_k$ | $m1_k$ | $m2_k$ |
|---|---|---|---|
| 0 | 0 | 0 | 0 |
| 0 | 1 | 1 | 0 |
| 1 | 0 | 0 | 0 |
| 1 | 1 | 0 | 1 |

Alternatively, the bitwise modulation signals $m1_k$ and $m2_k$ for the kth quadrature PCWM 108 can be derived as given by:

$$m1_k = \overline{\text{sign}} \cdot b_k$$

$$m2_k = \text{sign} \cdot b_k \quad (5)$$

Figure 7B:
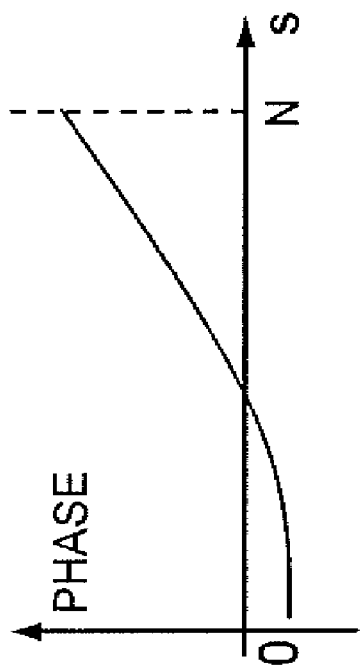
FIGS. 7(a) and 7(b) illustrates different waveforms associated with operation of an I-channel positive coefficient weighted modulator.
Figure 7A:
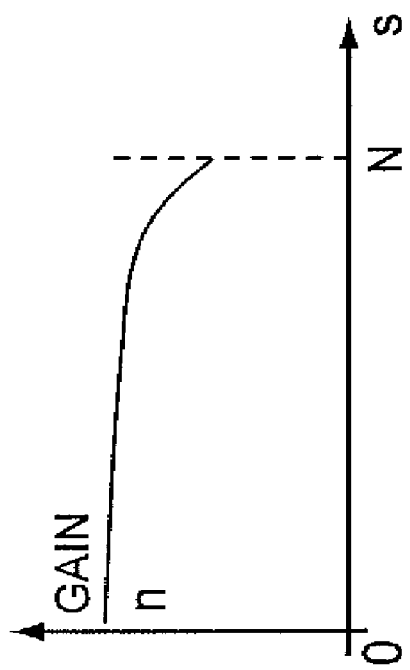

Of course, the above logic is not the only way to use the PCWM 108. Those skilled in the art will readily recognize that other variations of the above logic for using the PCWM 108 are within the purview of the embodiments disclosed herein. Each instance of the quadrature PCWM 108 shown in FIG. 1 is equivalent to N paralleled cells, $J_1, J_2, \ldots, J_N$, e.g. of a power amplifier structure. The N paralleled cells are subject to gain drop when the number of enabled cells increases as illustrated in FIG. 7(a) and phase shift as illustrated in FIG. 7(b) where N is the number of cells coupled in parallel, and where s is the number of enabled cells, respectively. For cells of equal size, gain drop appears in such a way that when fewer cells are enabled, the gain is higher compared to when more cells are enabled. Gain drop arises because once a cell is disabled the cell has much higher resistance than it does when enabled. A reduction in the load impedance or an increase in the output impedance of the cells can reduce the gain drop. Under extreme conditions, gain drop can be completely solved when the load impedance is zero or the output impedance is infinite. In the former, the output power efficiency is zero, and in the latter it is not possible. Phase shift arises because of the difference in reactance between the on-state impedance and the off-state impedance. Gain drop influences the amplitude of the output signal, and together with phase shift can destroy the EVM (Error Vector Magnitude) of the output signals. Gain drop may be compensated for in the analog or digital domain. However, phase shift compensation is more difficult when commingled with gain drop as it requires a two dimensional compensation technique. In order to avoid two-dimensional compensation and reduce the difficulty associated with unit cell design, it is desirable to minimize the phase shift.

Figure 8:
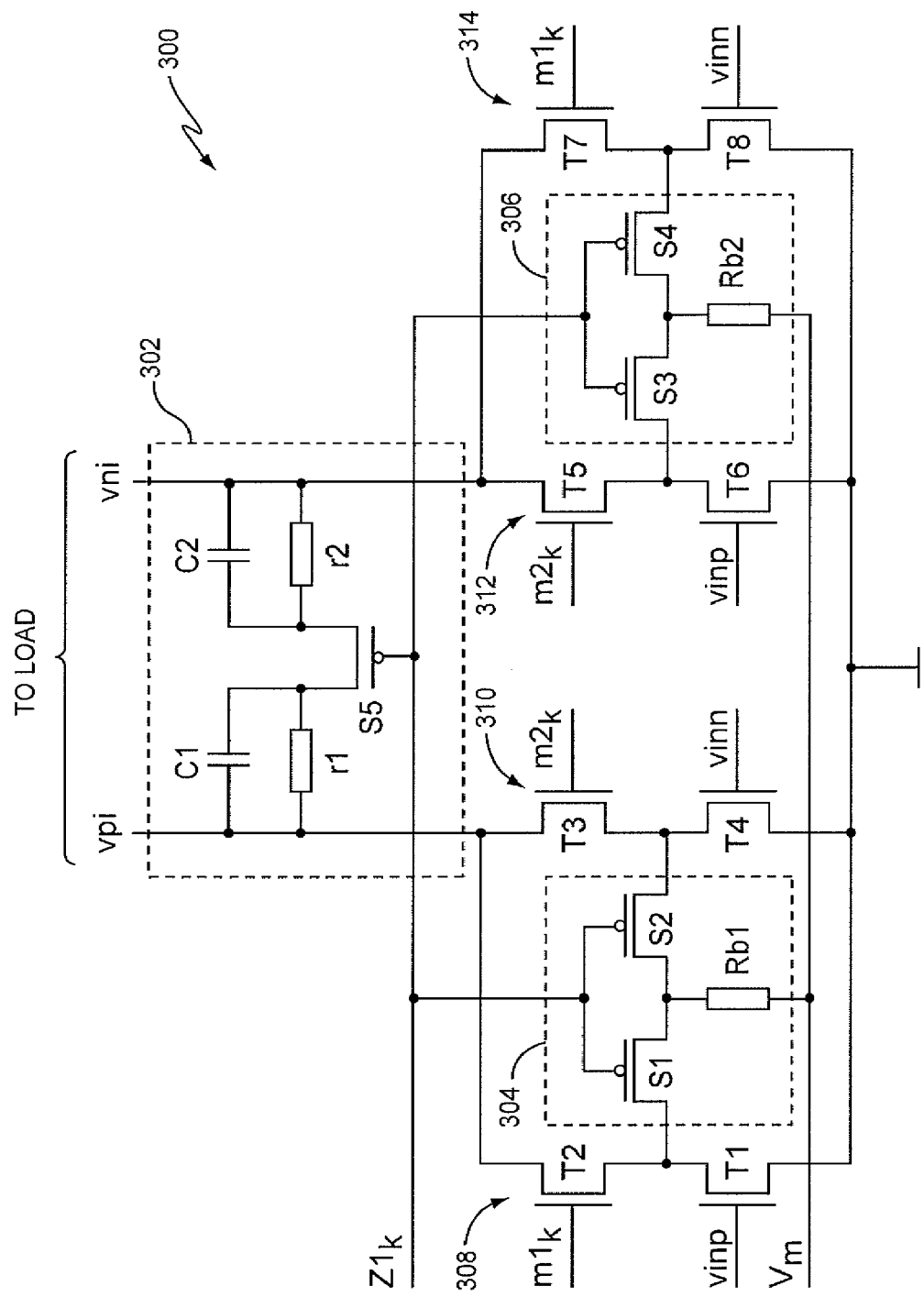
FIG. 8 illustrates a circuit diagram of an embodiment of an I-channel positive coefficient weighted modulator including impedance compensation and shutdown circuitry.

FIG. 8 illustrates an embodiment of an I-channel portion of a quadrature PCWM 300 which includes the I-channel PCWM modulator 200 shown in FIG. 6 optionally coupled to an impedance compensation circuit 302 which compensates for gain drop and reduce phase shift. The I-channel PCWM modulator 200 also has shut-down circuits 304, 306, to reduce clock leakage from clock nodes to the output nodes when the modulator is disabled. Those skilled in the art will readily recognize that a complimentary Q-channel PCWM can also include shut-down circuitry, and optionally have the same impedance compensation circuit. The impedance compensation circuit 302 is optionally coupled between the I-channel differential output nodes (vpi, vni) of the quadrature PCWM 300. For one case, every PCWM modulator 200 can have its own impedance compensation circuit 302, and for other cases, several PCWM modulators 200 not having impedance compensation circuits and one PCWM modulator 200 having an impedance compensation circuit are grouped together. The impedance compensation circuit 302 includes two RC circuits and a control transistor (S5). The first RC circuit includes a capacitor (c1) coupled in parallel with a resistor (r1) between a first terminal of transistor S5 and I-channel differential output node vpi. The second RC circuit similarly includes a capacitor (c2) coupled in parallel with a resistor (r2) between a second terminal of transistor S5 and I-channel differential output node vni. The control transistor S5 electrically connects the first and second RC circuits when the I-channel portion of the quadrature PCWM 300 is disabled, i.e. when both of the bitwise modulation signals $m1_k$ and $m2_k$ are logic low as shown in Table 1. Under these conditions, a control signal ($Z1_k$) applied to the gate of transistor S5 is in a logic low state, causing PMOS transistor S5 to switch on. The control signal $Z1_k$ is a function of the sign of binary signal $b_k$ as given by:

$$Z1_k = b_k \quad (6)$$

The control signal $Z1_k$ applied to the gate of control transistor S5 is in a logic high state to activate control transistor S5 if transistor S5 is an NMOS transistor instead of a PMOS transistor.

The control transistor S5 electrically disconnects the first and second RC circuits when the I-channel portion of the quadrature PCWM 300 is enabled, i.e. when either of the bitwise modulation signals $m1_k$ and $m2_k$ is logic high as shown in Table 1. Similar output impedance compensation can be provided for the Q-channel portion of the quadrature PCWM 300. Activating the control transistor S5 as a function of the operational state of the quadrature PCWM 300 causes the output impedance of the quadrature PCWM 300 to remain relatively unchanged in both enabled and disabled states, thus extending the linear region of the gain drop curve shown in FIG. 7(a) and reducing phase shift.

Each shut-down circuit 302, 304 included in the I-channel portion of the quadrature PCWM 300 is coupled between a pair of the braches 308, 310 and 312, 314 having coupled output nodes. The shutdown circuits 304, 306 electrically connect the output nodes of the common source transistors of the corresponding branches and couple the output nodes to a bias voltage (Vm) when the I-channel portion of the quadrature PCWM 300 is disabled. Each shutdown circuit 304, 306 includes two series connected shutdown transistors (S1/S2 or S3/S4). The source terminal of one shutdown transistor is connected to the output node of the common source transistors of one corresponding branch and the source terminal of the other shutdown transistor is connected to the output node of the common source transistors of the other corresponding branch. The drain terminals of the shutdown transistors are electrically connected together and to the bias voltage Vm.

Operation of the shut-down circuits 304, 306 is described next with reference to the shutdown transistors as PMOS transistors. Those skilled in the art will readily recognize that the same operation can be achieved by reversing the state of the shut-down control signals if the shutdown transistors are NMOS transistors instead of PMOS transistors. During operation, the shut-down circuits 304, 306 are disabled when the control signal $Z1_k$ is in a logic high state. When the quadrature PCWM 300 is disabled, PMOS transistors S1-S4 short the floating nodes at the drains of the corresponding RF transistors T1/T4 and T6/T8 so that parasitic leakage from the clock inputs vine, vine to the RF I-channel output node vpi, vni of the quadrature PCWM 300 is effectively reduced. Also during the disable state, the floating nodes at the drains of the RF transistors T1, T4, T6 and T8 are connected to the bias voltage Vm, which provides a weak current leakage to the respective drains of the RF transistors and maintains a certain voltage potential close to the operating voltage when the I-channel portion of the quadrature PCWM 300 is enabled. In such a way, the shut-down circuits 304, 306 reduce the switching disturbance caused by charging and discharging that occurs during a transition from the enabled state to the disabled state, or vice versa. As mentioned above, shut-down transistors S1-S5 can be replaced by NMOS transistors with inverse control logic signaling. Also, additional common gate configured NMOS transistors can be inserted between the drains of NMOS transistors, T2, T3, T5 and T7 and the output nodes vpi and vni for relaxing the break-down requirements for T2, T3, T5 and T7, as stacked transistors. Those skilled in the art will readily recognize that similar shutdown circuitry can be included in the Q-channel portion of the quadrature PCWM 300. The impedance compensation and shut-down circuitry improves the gain drop and phase shift performance of the quadrature PCWM cells described herein.

Figure 9:
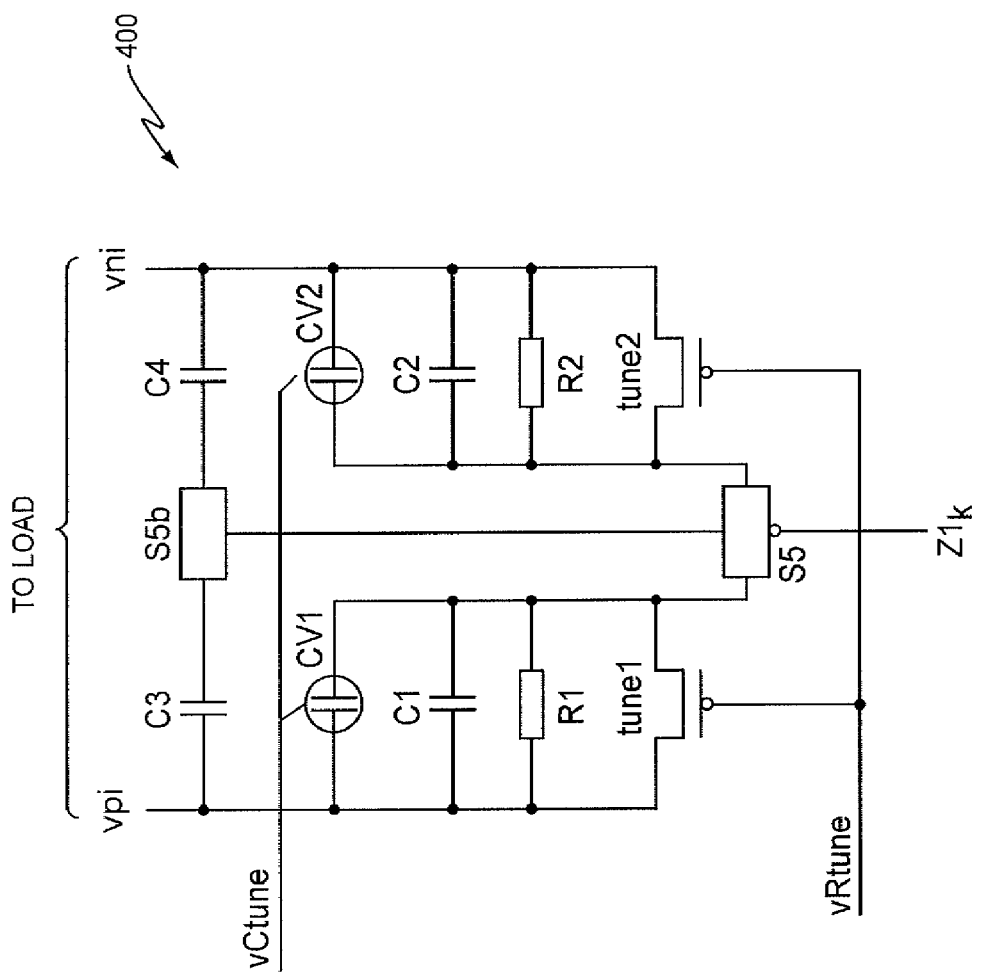
FIG. 9 illustrates a circuit diagram of a differential impedance compensation circuit for use with am I-channel or Q-channel positive coefficient weighted modulator.

FIG. 9 illustrates another embodiment of an impedance compensation circuit 400 for use with the quadrature PCWM cells described herein. According to this embodiment, each RC circuit (c1/r1 and c2/r2) of the impedance compensation circuit 400 further includes a tunable capacitive device (cv1, cv2) and a tunable resistive device (tune1, tune2) connected in parallel with the resistor (r1, r2) and capacitor (c1, c2) of the corresponding RC circuit. Capacitors c1 and c2 and resistors r1 and r2 provide impedance compensation when either the I-channel or Q-channel portion of a quadrature PCWM cell is disabled. Transistors tune1 and tune2 controlled by a tuning voltage vRtune, behave as variable resistance devices which provide fine tuning for resistance matching. Similarity, varactors cv1 and cv2 controlled by another tuning voltage, vCtune, behave as variable capacitance devices which provide fine tuning for capacitance matching. Adding the tunable capacitive and resistive devices to the impedance compensation circuit 400 further reduces the phase shift which can arise when switching between enabled and disabled states.

In normal cases, the output nodes of the quadrature PCWM cell have higher parasitic capacitance when the cell is enabled as compared to when the cell is disabled. In exceptional cases, the cell may have lower parasitic capacitance when the cell is enabled as compared to when the cell is disabled, and the impedance compensation circuit 400 optionally includes additional capacitors (c3 and c4) and an additional NMOS control transistor (S5b). Control transistor S5b couples the additional capacitance between the I-channel differential output nodes (vpi, vni) of the corresponding quadrature PCWM cell (or Q-channel output nodes) when the I-channel (or Q-channel) portion of the cell is enabled and decouples the additional capacitance when the I-channel (or Q-channel) portion of the cell is disabled. Transistor S5b is controlled by signal $Z1_k$ and is complementary to control transistor S5. That is, if S5 is on S5b is off and vice-versa. In normal cases, capacitors c3, c4 and control transistor S5b are not present, and in exceptional cases, capacitors c1 and c2 are not present. In either case, the impedance compensation circuit 400 provides resistive and capacitive fine tuning capability while accounting for parasitic capacitance of the quadrature PCWM cell to which the compensation circuit is coupled. A plurality of quadrature PCWM cells of the kind disclosed herein can be coupled together to form the DQMPA of FIG. 1.

Figure 10:
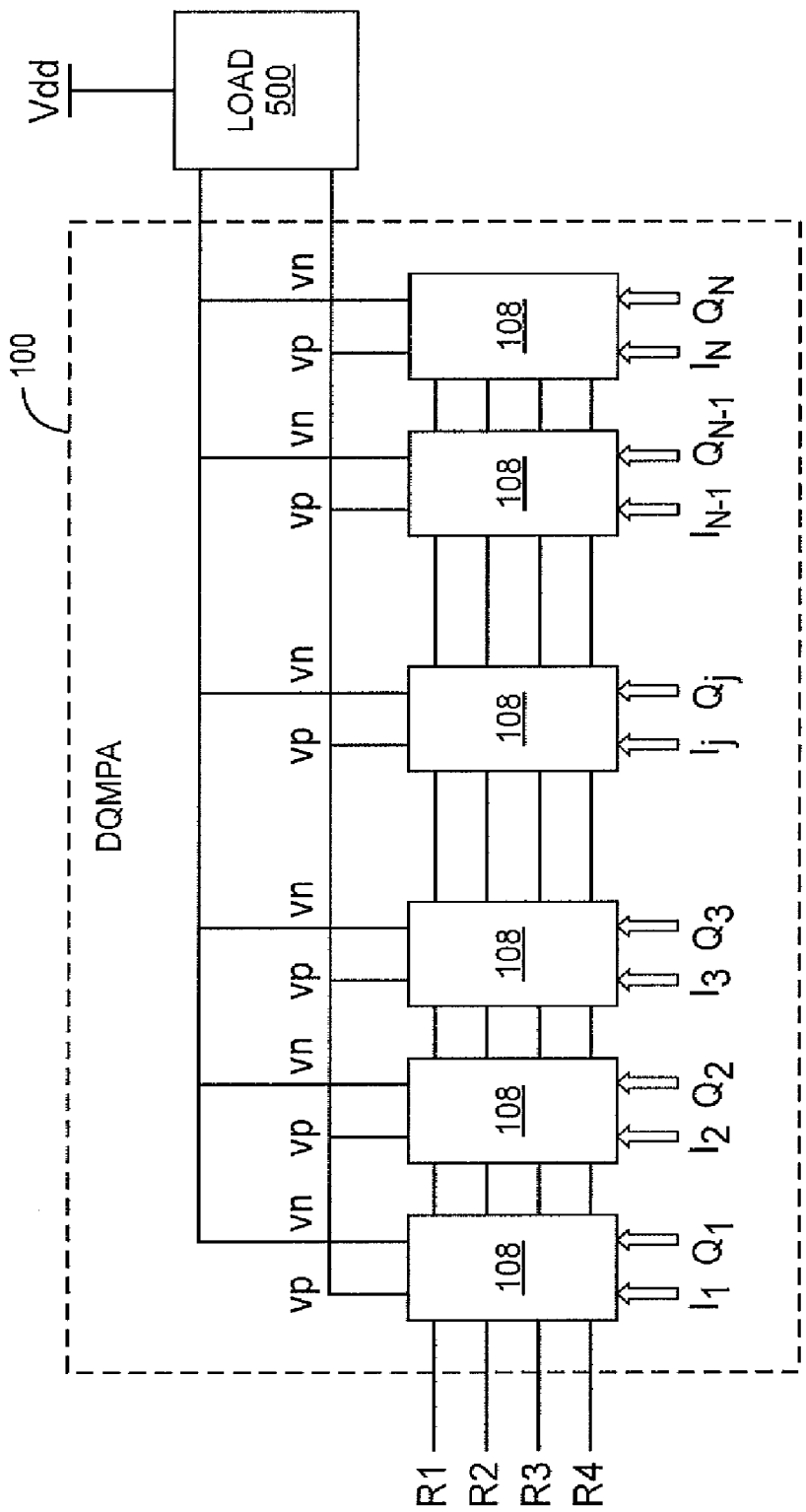
FIG. 10 illustrates a block diagram of an embodiment of a digital quadrature modulated differential power amplifier directly coupled to a load.

FIG. 10 illustrates an embodiment of the DQMPA 100 having a plurality of the quadrature PCWMs 108 directly coupled to a load 500. Each of the quadrature PCWMs 108 includes I-channel and Q-channel PCWM cells 200, 202 of the kind disclosed herein. According to this embodiment, a first differential component (e.g. vpi and vpq) of the I-channel and Q-channel signals output by each of the quadrature PCWMs 108 are directly connected together to a first terminal of the load 500. The second, complimentary component (e.g. vni and vnq) of the differential I-channel and Q-channel signals output by each of the quadrature PCWMs 108 are likewise directly connected together to a second terminal of the load 500. The I and Q channel outputs can be merged by wire connections. However, non-linear crosstalk compensation may be desirable because the I and Q channel outputs can crosstalk with each other, especially when the signal amplitudes are large. Non-linearity caused by output crosstalk and gain drop can be compensated by two-dimensional digital compensation methods.

Figure 11:
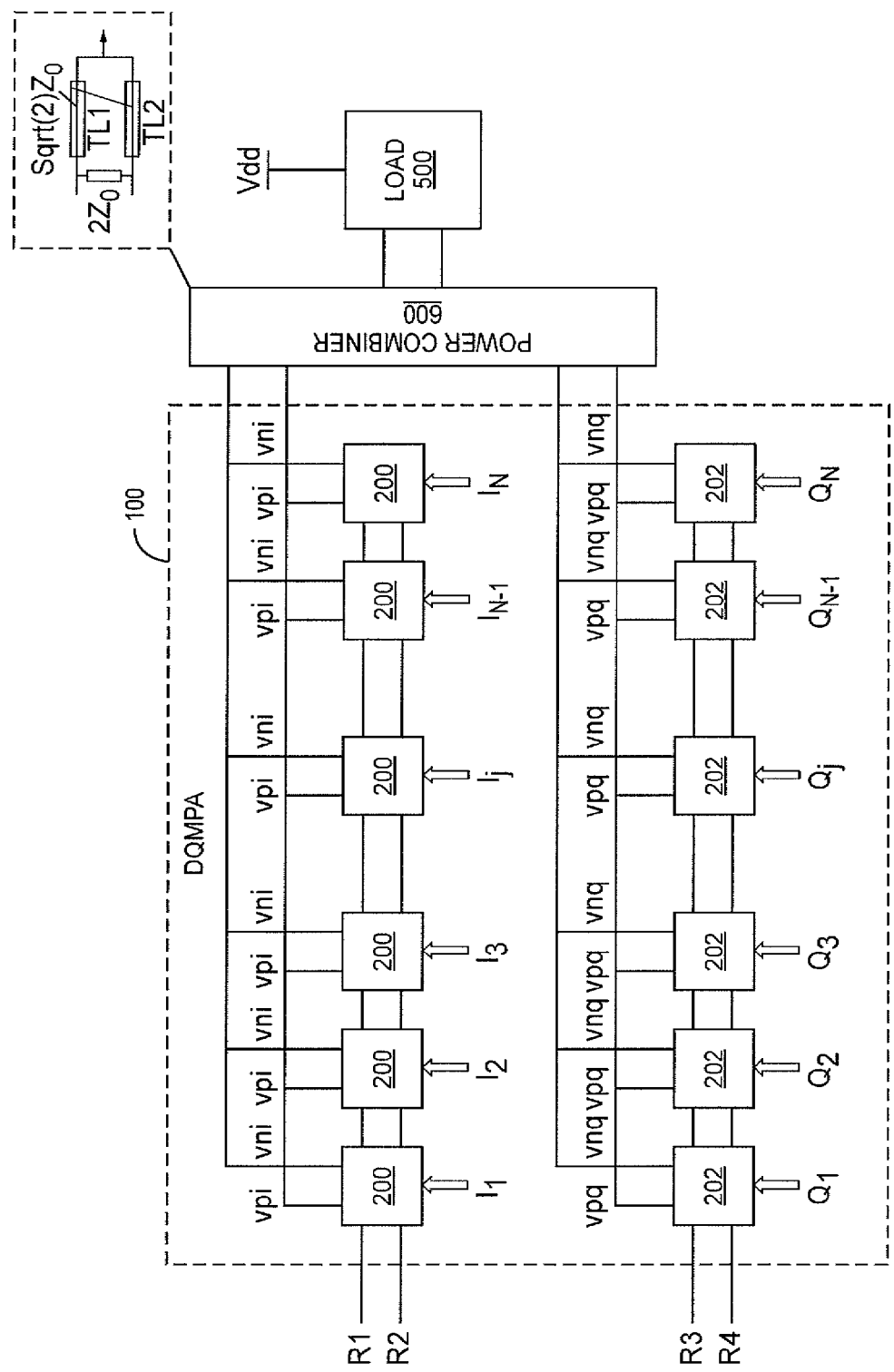
FIG. 11 illustrates a block diagram of an embodiment of a digital quadrature modulated differential power amplifier coupled to a load via a power combiner.

FIG. 11 illustrates another embodiment of the DQMPA 100 which has a plurality of the quadrature PCWMs 108 coupled to the load 500 via a differential power combiner 600. Again, each of the quadrature PCWMs 108 includes I-channel and Q-channel PCWM cells 200, 202 of the kind disclosed herein. According to this embodiment, the differential output nodes (vpi I vni and vpq I vnq) of each quadrature PCWM 108 is coupled to the load 500 via the differential power combiner 600. In one embodiment, the differential power combiner 500 includes two two-way Wilkinson power combiners. The first two-way Wilkinson power combiner input ports are coupled to the positive I-channel and Q-channel output nodes (vpi I vpq), and the second Wilkinson power combiner input ports are coupled to the negative I-channel and Q-channel output nodes (vni I vnq). The output port of the differential power combiner 600 are coupled to the differential load 500, i.e., the first input node of the load 500 is coupled to the output port of the first Wilkinson power combiner, and the second input node of the load 500 is coupled to the output port of the second Wilkinson power combiner. The Wilkinson power combiners provide isolation between the differential I-channel and Q-channel outputs, hence one-dimensional digital compensation methods are sufficient as the phase shift introduced by impedance change are well compensated by described impedance compensation circuit 302, 400.

The exploded region represented by the dashed box shown in FIG. 11 illustrates one of the Wilkinson power combiners in more detail. The Wilkinson power combiner includes transmission lines TL1 and TL2 coupled to the differential I-channel or Q-channel outputs as represented by impedance $Z_0$. The transmission lines TL1 and TL2 are quarter wavelength and have a characteristic impedance of $\sqrt{2} \cdot Zo$. Alternatively, the Wilkinson power combiners can be implemented by replacing the transmission lines with a number of LC components such as Γ networks.

Each quadrature PCWM 108 included in the DQMPA 100 of FIGS. 10 and 11 can have its own impedance compensation circuit 302, 400 of the kind previously disclosed herein. Alternatively, a group of PCWM cells can be coupled to a single impedance compensation circuit 302, 400. In general, an impedance compensation circuit 302, 400 is shared by Mc basic PCWM cell/cells, where Mc≧1 and is an integer. For the uniform and thermometer-coded case, Mc is a constant. For the non-uniformed thermometer-coded case, Mc can be a variable. That is, among Mc basic PCWM cells, only one PCWM cell has an impedance compensation circuit 302, 400, and the other PCWM cells do not have an impedance compensation circuit. In affect, the impedance compensation circuit 302, 400 is thus shared by Mc PCWM cells. The impedance compensation circuit 302, 400 can be shared in both the uniform and non-uniform cases. In the non-uniform case the compensation impedance can be controlled by varying the integer Mc. Sharing the impedance compensation circuit 302, 400 among Mc PCWM cells of a DQMPA increases the area efficiency of the DQMPA, particularly when PCWM cell size is small and the size of the components used in the impedance compensation circuit are also very small.

The quadrature clock signals input to the quadrature PCWMs 108 of FIGS. 10 and 11 are AC coupled and DC biased. The amplitudes of the clock signals can be set by a programmable capacitor attenuation array, e.g. included in or associated with the clock driver circuit 106 of FIG. 1. The DC bias can be programmed by a bias DAC, e.g. also included in or associated with the clock driver circuit 106 of FIG. 1. Therefore, the over-drive status of the clock signals can be changed. For example, a larger clock signal over-drive voltage and a smaller conducting angle can increase power efficiency at the expense of more spurious harmonic emissions in the radio spectrum. However, the harmonics can be removed from the final load (the antenna), e.g. by filtering. Tuning the over-drive voltage of the local oscillator clock signals can also be used to better match the compensation curves, either in the digital or analog domain.

Figure 12A:
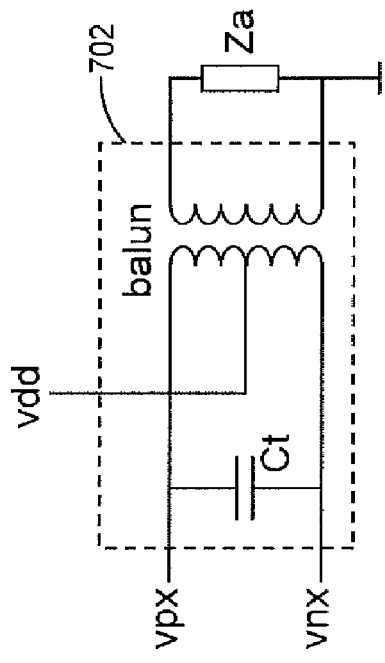
FIGS. 12(a)-(d) illustrate circuit diagrams of different embodiments of networks for coupling a digital quadrature modulated differential power amplifier to a load.
Figure 12B:
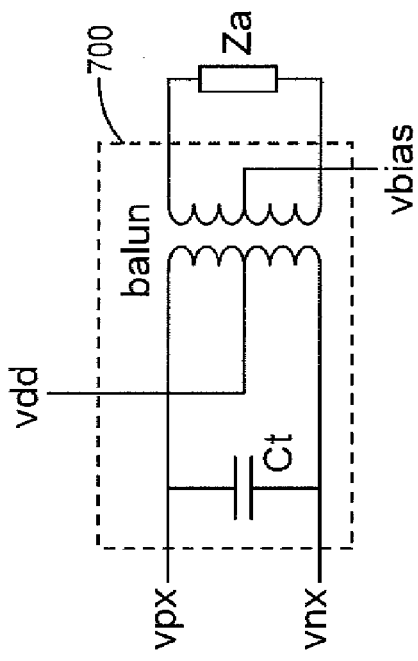
Figure 12C:
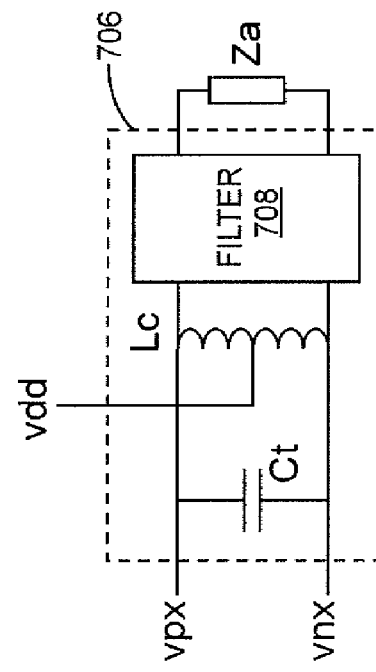
Figure 12D:
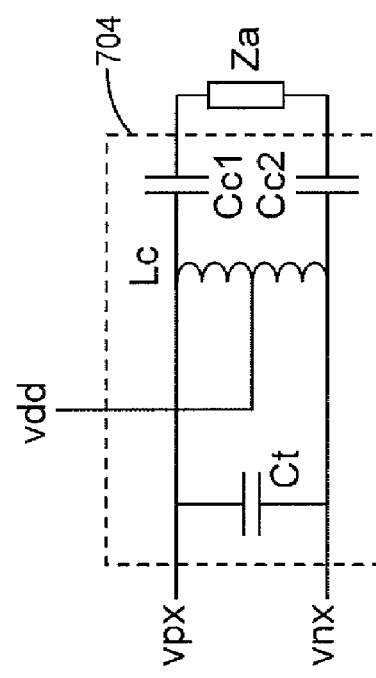

FIGS. 12(a)-(d) show different embodiments for coupling the load (Za) of an antenna to the output nodes vpx and vnx of the quadrature PCWMs 108 of FIGS. 10 and 11. In FIG. 12(a), a network 700 of balanced differential nodes is used for coupling to a load having antenna impedance Za. The network 700 includes a capacitor (Ct) and a balun. In FIG. 12(b), a network 702 of balanced differential nodes is configured in single-ended mode and in FIG. 12(c) a network 704 is directly AC coupled via capacitors Cc1 and Cc2 to the load in differential mode. FIG. 12(d) shows a network 706 that couples the current output nodes vpx and vnx to the load through a filter 706 or other passive components. For the quadrature PCWM 108 of FIG. 11, vpx and vnx in FIGS. 12(a)-12(d) correspond respectively to the first Wilkinson output port and the second Wilkinson output node. Alternatively, vpx and vnx in FIGS. 12(a)-12(d) correspond respectively to the merged outputs vp and vn for each quadrature PCWM 108 included in the DQMPA 100 of FIG. 10.

The output power of the DQMPA 100 is related to the load impedance, and is preferably optimized to maximize power efficiency. On the other hand, the output voltage of the DQMPA 100 is preferably kept suitably low to satisfy the linearity requirements for different radio standards. In this case, the output power of a single DQMPA 100 may not be sufficient. To increase the output power and maintain linearity, multiple DQMPAs 100 can be used. For example, radio standards such as LTE (Long Term Evolution) mandate spectrum aggregation, meaning multiple DQMPAs 100 may be needed.

Figure 13:
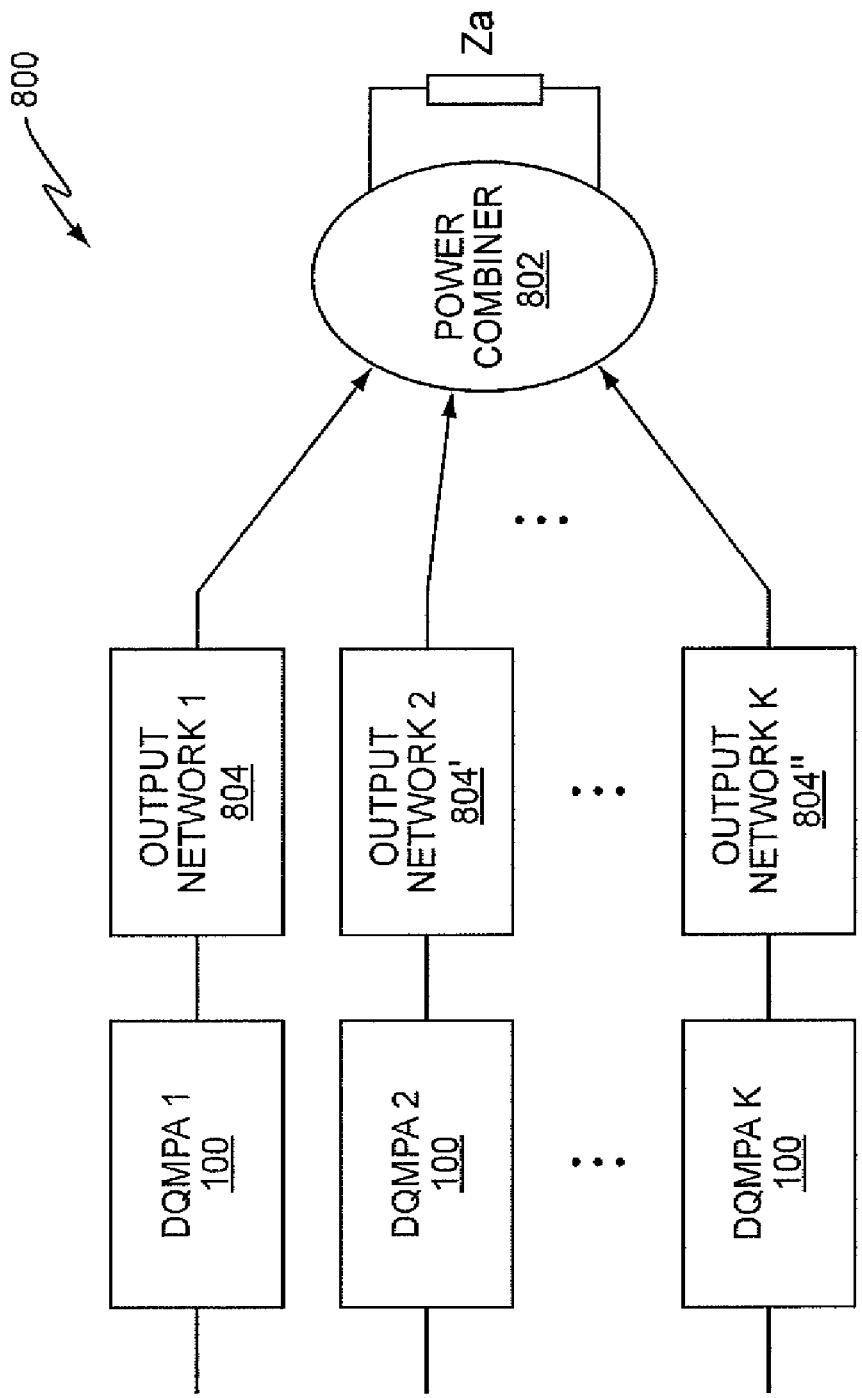
FIG. 13 illustrates a block diagram of an embodiment of a plurality of digital quadrature modulated differential power amplifiers coupled to a load via respective output networks.

FIG. 13 illustrates an embodiment of a system 800 including a plurality of the DQMPAs 100 coupled to a load represented by impedance Za. The load is connected to a power combiner 802 and each of the DQMPAs 100 is coupled to the power combiner 802 via a corresponding output network 804. The power combiner 802 can be implemented with passive components, e.g. transformers, and the power combiner 802 can be either single-ended or differential.

Figure 14:
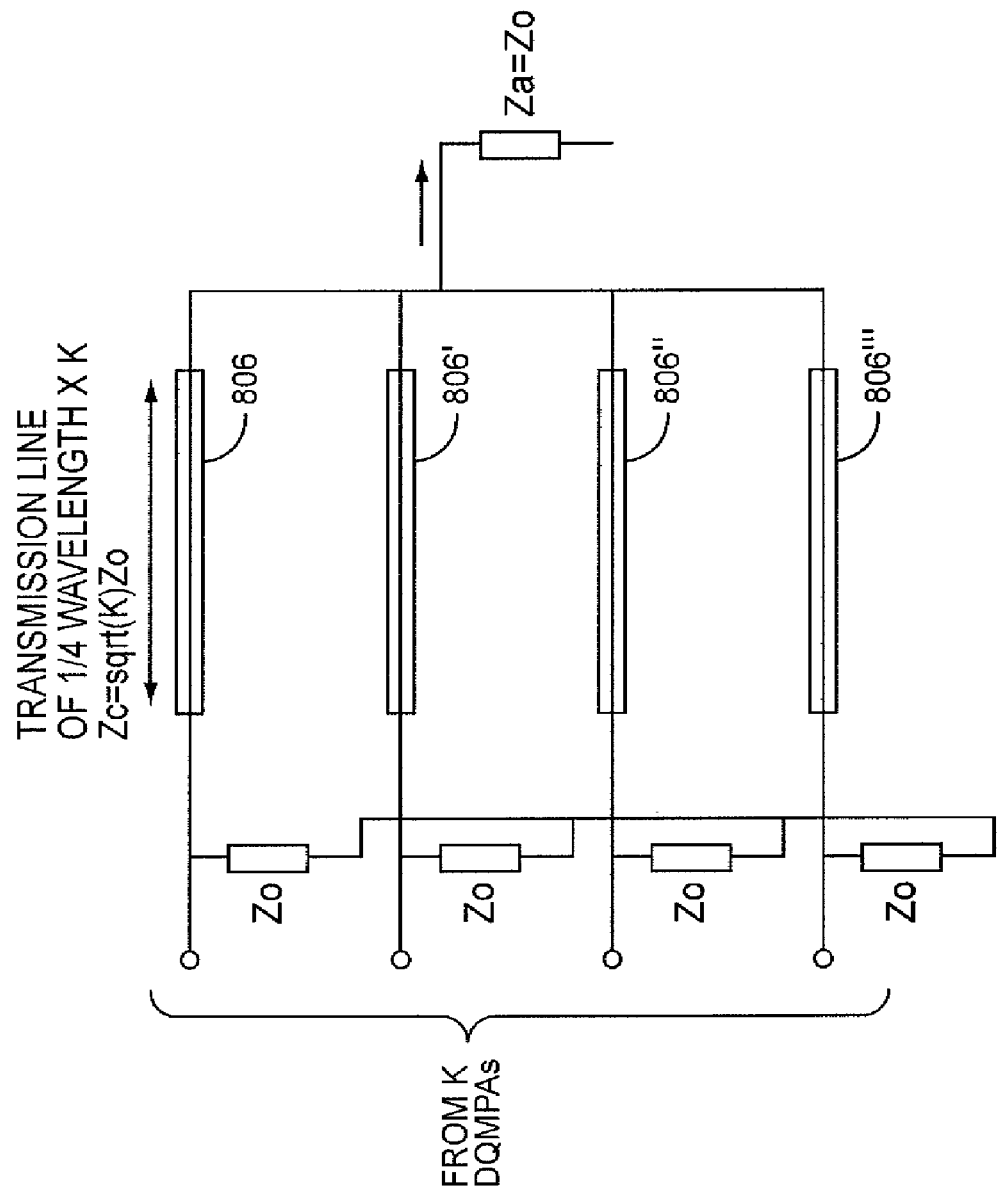
FIG. 14 illustrates a block diagram of another embodiment of a network for coupling a plurality of digital quadrature modulated differential power amplifiers to a load.

FIG. 14 illustrates another embodiment where the DQMPAs 100 are coupled to the load via Wilkinson power combiners 806. Each Wilkinson power combiner 806 includes a ¼ wavelength transmission line having an impedance (Zc) that is a function of the output impedance (Zo) of the corresponding DQMPA 100. Several stages of power combiners can be formed by using a hierarchy structure so that more power couplers can be connected in a tree-like manner. Doing so eases the DC power delivery demand placed on each individual power coupler. Each Wilkinson power combiner 806 can be either single-ended or differential.

A DQMPA 100 having N quadrature PCWMs 108 has acceptable linearity for small signal levels so that the DQMPA 100 operates within a linear region. However, as input signal amplitude increases close to the compression point of the DQMPA 100, the gain drops because of a clamping effect caused by the limited supply voltage. This causes non-linearity as shown in FIG. 15(a). Under these conditions, a pre-distortion function such as the one shown in FIG. 15(b) is applied. The pre-distortion function is the inverse of the DQMPA gain function and compensates for gain drop, and the pre-distortion can be implemented in the digital domain by a Look-Up Table (LUT), yielding a more constant gain function. The output impedance compensation schemes illustrated in FIGS. 8 and 9 and previously described herein are less ideally suited to compensate for DQMPA gain drop when the signal amplitude is close to or higher than the compression point of the DQMPA 100. However, various techniques are disclosed herein to compensate for this and extend the linear region of the DQMPA gain function, further improving power efficiency.

FIG. 15(c) illustrates one embodiment where non-uniform and thermometer-coded DQMPA cells are employed. According to this embodiment, the size of the individual DQMPA cells can be made larger when the signal level becomes higher. If the gain function in the linear region is suitably flat, it is also possible to use uniform DQMPA cells and compensation cells together, as illustrated in FIG. 15(d), to boost the gain in the non-linear region. Doing so effectively reduces the size of a LUT used for digital pre-distortion. A drop or unevenness in the gain function can also be compensated for in the digital domain, e.g. using either uniform DQMPA cells with a complete digital compensation map as illustrated in FIG. 15(e) or non-uniform cells with digital compensation correction as illustrated in FIG. 15(f).

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A differential quadrature modulator comprising:
   an I-channel positive coefficient weighted modulator having differential output nodes configured to output a differential I-channel signal responsive to the state of first and second positive digital modulation signals and first and second complimentary quadrature clock signals input to the I-channel positive coefficient weighted modulator; and
   a Q-channel positive coefficient weighted modulator having differential output nodes configured to output a differential Q-channel signal responsive to the state of third and fourth positive digital modulation signals and third and fourth complimentary quadrature clock signals input to the Q-channel positive coefficient weighted modulator; and
   wherein the positive digital modulation signals have positive amplitude and the I-channel and Q-channel positive coefficient weighted modulators conduct at approximately half clock cycle or less of the corresponding quadrature clock signals.

2. The differential quadrature modulator of claim 1, further comprising an impedance compensation circuit coupled between the differential output nodes of each positive coefficient weighted modulator.

3. The differential quadrature modulator of claim 2, wherein each impedance compensation circuit comprises a first RC circuit coupled between a first terminal of a transistor and one of the differential output nodes of the corresponding positive coefficient weighted modulator and a second RC circuit coupled between a second terminal of the transistor and the other differential output node of the positive coefficient weighted modulator, each of the transistors being operable to electrically connect the corresponding first and second RC circuits responsive to the corresponding positive coefficient weighted modulator being disabled and electrically disconnect the first and second RC circuits responsive to the positive coefficient weighted modulator being enabled.

4. The differential quadrature modulator of claim 3, wherein each of the RC circuits comprises a capacitor coupled in parallel with a resistor.

5. The differential quadrature modulator of claim 4, wherein each of the RC circuits further comprises a tunable capacitive device and a tunable resistive device connected in parallel with the resistor and the capacitor of the RC circuit.

6. The differential quadrature modulator of claim 3, wherein each impedance compensation circuit further comprises an additional transistor operable to couple an additional capacitance between the differential output nodes of the corresponding positive coefficient weighted modulator responsive to the positive coefficient weighted modulator being enabled and to decouple the additional capacitance responsive to the positive coefficient weighted modulator being disabled.

7. The differential quadrature modulator of claim 1, wherein the I-channel and the Q-channel positive coefficient weighted modulators each comprise four branches, the first and second braches of the I-channel positive coefficient weighted modulator being operable to generate a first component of the differential I-channel signal, the third and fourth braches of the I-channel positive coefficient weighted modulator being operable to generate a second complimentary component of the differential I-channel signal, the first and second braches of the Q-channel positive coefficient weighted modulator being operable to generate a first component of the differential Q-channel signal, and the third and fourth braches of the Q-channel positive coefficient weighted modulator being operable to generate a second complimentary component of the differential Q-channel signal.

8. The differential quadrature modulator of claim 7, wherein each of the branches comprises a common source transistor connected in series with a common gate transistor, the drains of the common source and the sources of the common gate transistors are electrically connected together, the drain of the common gate transistor is connected to an output node of the branch, the gate of the common gate transistor is connected to a control node of the branch, the source of the common source transistor is connected to a ground node of the branch and the gate of the common source transistor is connected to a clock input node of the branch.

9. The differential quadrature modulator of claim 7, further comprising a shutdown circuit coupled between each pair of the braches having coupled output nodes, each shutdown circuit being operable to electrically connect common drain regions of both corresponding branches and couple the common drain regions to a bias voltage responsive to the corresponding positive coefficient weighted modulator being disabled.

10. The differential quadrature modulator of claim 9, wherein each shutdown circuit comprises two series connected shutdown transistors, a source terminal of one shutdown transistor is connected to the common drain region of one corresponding branch, the source terminal of the other shutdown transistor is connected to the common drain region of the other corresponding branch and drain terminals of the shutdown transistors are electrically connected together and to the bias voltage.

11. A digital quadrature modulated differential power amplifier comprising a plurality of the differential quadrature modulators recited in claim 1 coupled to a load.

12. The digital quadrature modulated differential power amplifier of claim 11, comprising digital logic operable to convert original digital modulation signals into the positive digital modulation signals input to each of the plurality of differential quadrature modulators included in the digital quadrature modulated differential power amplifier.

13. The digital quadrature modulated differential power amplifier of claim 11, wherein a first component of the differential I-channel and Q-channel signals output by each of the differential quadrature modulators are directly connected together to a first terminal of the load and a second complimentary component of the differential I-channel and Q-channel signals output by each of the differential quadrature modulators are directly connected together to a second terminal of the load.

14. The digital quadrature modulated differential power amplifier of claim 11, further comprising a differential power combiner operable to couple the differential output nodes of each differential quadrature modulator to the load, wherein the differential power combiner comprises first and second Wilkinson power combiners, a first component of the differential I-channel and Q-channel signals being coupled to a first terminal of the load via the first Wilkinson power combiner, and a second, complimentary component of the differential I-channel and Q-channel signals being coupled to a second terminal of the load via the second Wilkinson power combiner.

15. The digital quadrature modulated differential power amplifier of claim 11, further comprising one or more additional digital quadrature modulated differential power amplifiers, wherein the load is connected to a power combiner and each of the digital quadrature modulated differential power amplifiers is coupled to the power combiner via a respective output network.

16. The digital quadrature modulated differential power amplifier of claim 11, wherein at least some of the plurality of differential quadrature modulators share the same impedance compensation circuit.

17. An RF transmitter comprising the digital quadrature modulated differential power amplifier recited in claim 11, a baseband processor operable to provide in-phase and quadrature information signals to the digital quadrature modulated differential power amplifier for amplification, a clock driver circuit operable to provide the quadrature clock signals to the digital quadrature modulated differential power amplifier and wherein the load comprises an antenna.

18. A method of amplifying quadrature information signals comprising:
- generating a differential I-channel signal at differential output nodes of an I-channel positive coefficient weighted modulator responsive to the state of first and second positive digital modulation signals and first and second complimentary quadrature clock signals input to the I-channel positive coefficient weighted modulator;
- generating a differential Q-channel signal at differential output nodes of a Q-channel positive coefficient weighted modulator responsive to the state of third and fourth positive digital modulation signals and third and fourth complimentary quadrature clock signals input to the Q-channel positive coefficient weighted modulator; and
- wherein the positive digital modulation signals have positive amplitude and the I-channel and Q-channel positive coefficient weighted modulators conduct at approximately half clock cycle or less of the corresponding quadrature clock signals.

19. The method of claim 18, further comprising:
- coupling a compensation impedance between the differential output nodes of one of the positive coefficient weighted modulators responsive to that positive coefficient weighted modulator being disabled; and
- decoupling the compensation impedance from the differential output nodes responsive to the corresponding positive coefficient weighted modulator being enabled.

20. The method of claim 19, comprising coupling the compensation impedance between the differential output nodes responsive to the positive digital modulation signals input to the corresponding positive coefficient weighted modulator being in a logic low state.

21. The method of claim 19, further comprising:
- coupling an additional capacitance between the differential output nodes of one of the positive coefficient weighted modulators responsive to that positive coefficient weighted modulator being enabled; and
- decoupling the additional capacitance from the differential output nodes responsive to the corresponding positive coefficient weighted modulator being disabled.

22. The method of claim 18, further comprising reducing a bias of the quadrature clock signals so that signal multiplication components of the I-channel and Q-channel positive coefficient weighted modulators conduct at approximately half clock cycle or less.

23. The method of claim 18, further comprising coupling a first component of the differential I-channel and Q-channel signals to a first terminal of a load and a second complimentary component of the differential I-channel and Q-channel signals to a second terminal of the load.

24. The method of claim 18, further comprising coupling a first component of the differential I-channel and Q-channel signals to a first terminal of a load via a first Wilkinson power combiner and a second, complimentary component of the differential I-channel and Q-channel signals to a second terminal of the load via a second Wilkinson power combiner.

25. The method of claim 18, further comprising:
- coupling the differential I-channel and Q-channel signals to an output network;
- coupling the output network to a power coupler; and
- coupling the power coupler to a load.

26. The method of claim 25, further comprising extending linearity of the differential I-channel and Q-channel signals by applying pre-distortion over a non-linear gain region of the differential I-channel and Q-channel signals.

* * * * *

UNITED STATES PATENT AND TRADEMARK OFFICE
CERTIFICATE OF CORRECTION

PATENT NO. : 7,902,937 B2
APPLICATION NO. : 12/534294
DATED : March 8, 2011
INVENTOR(S) : Mu It is certified that error appears in the above-identified patent and that said Letters Patent is hereby corrected as shown below:

In Column 4, Line 63, delete "braches" and insert -- branches --, therefor.

In Column 4, Line 67, delete "braches" and insert -- branches --, therefor.

In Column 5, Line 3, delete "braches" and insert -- branches --, therefor.

In Column 5, Line 8, delete "braches" and insert -- branches --, therefor.

In Column 6, Line 23, delete "vpilvni." and insert -- vpi/vni. --, therefor.

In Column 8, Line 62, delete "braches" and insert -- branches --, therefor.

In Column 9, Line 20, delete "vine, vine" and insert -- vinp, vinn --, therefor.

In Column 10, Line 44, delete "(vpi I vni and vpq I vnq)" and
insert -- (vpi / vni and vpq / vnq) --, therefor.

In Column 10, Line 50, delete "(vpi I vpq)," and insert -- (vpi / vpq), --, therefor.

In Column 10, Line 52, delete "(vni I vnq)." and insert -- (vni / vnq). --, therefor.

In Column 11, Line 3, delete " $\sqrt{2} \cdot Z_o$ " and insert -- $\sqrt{2} \cdot Z_o$ --, therefor.

In Column 13, Line 58, in Claim 7, delete "braches" and insert -- branches --, therefor.

In Column 13, Line 61, in Claim 7, delete "braches" and insert -- branches --, therefor.

Signed and Sealed this
Eighth Day of November, 2011

David J. Kappos
*Director of the United States Patent and Trademark Office*

CERTIFICATE OF CORRECTION (continued)
U.S. Pat. No. 7,902,937 B2

In Column 13, Line 64, in Claim 7, delete "braches" and insert -- branches --, therefor.

In Column 13, Line 67, in Claim 7, delete "braches" and insert -- branches --, therefor.

In Column 14, Line 16, in Claim 9, delete "braches" and insert -- branches --, therefor.